United States Patent [19]

Grebe

[11] 3,849,136

[45] Nov. 19, 1974

[54] MASKING OF DEPOSITED THIN FILMS BY USE OF A MASKING LAYER PHOTORESIST COMPOSITE

[75] Inventor: Kurt R. Grebe, Beacon, N.Y.

[73] Assignee: International Business Machines Corporation, Armonk, N.Y.

[22] Filed: July 31, 1973

[21] Appl. No.: 384,349

[52] U.S. Cl. .................................. 96/36.2, 117/212
[51] Int. Cl. ........................... G03c 5/00, B44d 1/18
[58] Field of Search ................ 117/212; 96/36, 36.2

[56] References Cited

UNITED STATES PATENTS 3,228,794 1/1966 Ames ................................ 117/212

*Primary Examiner*—John D. Welsh
*Attorney, Agent, or Firm*—Jackson E. Stanland

[57] ABSTRACT

A method and structure for use in depositing thin films which avoids edge-tearing of the films. The structure is a composite comprising a photosensitive layer (photoresist) on the substrate onto which deposition is to occur, and an overlaying masking layer (which is conveniently a metal such as aluminum). Apertures in the photoresist layer and the masking layer expose portions of the substrate. The masking layer acts as a deposition mask which is spaced away from the substrate at a distance equal to the thickness of the underlying photoresist layer. The photoresist layer acts to keep the masking layer in close proximity to the substrate and is patterned through the use of the overlying masking layer as an exposure mask. Recession of the edges of the photoresist layer is achieved by overexposure and subsequent development. In this manner, the masking layer overhangs the photoresist layer, thereby providing an undercut in order to prevent edge-tearing of deposited films.

18 Claims, 8 Drawing Figures

MASKING OF DEPOSITED THIN FILMS BY USE OF A MASKING LAYER PHOTORESIST COMPOSITE

BACKGROUND OF THE INVENTION

1. Field of the Invention

This invention relates to a mask for the deposition of thin films and a process for depositing thin films on various substrates in a manner which avoids edge-tearing which can occur in many deposition processes.

2. Description of the Prior Art

Present trends in the patterning of vacuum deposited thin films make use of etching in the presence of an etch-resistant photoresist layer adjacent to the substance onto which the deposition is to occur. However, there may be occasions when it is preferable to use alternate methods because of possible harmful effects of the etchant to the substrate or to other layers which may be present, or for other reasons. Commonly used alternatives involve the use of methods denoted by the terms "expendable mask method," "lift-off method," or "stencil method." The following references are typical of those describing these known types of methods.

1. T. D. Schlaback et al., "Printed and Integrated Circuitry," pages 352–353, McGraw-Hill New York 1963.
2. K. C. Hu, "Expendable Mask: A New Technique for Patterning Evaporated Metal Films," Electron Packaging and Production, October 1967.
3. M. Hatzakis, "Electron Resist for Micro-Circuit and Mask Production," J. Electro-Chemical Society, 116, 1033 (1969).
4. H. I. Smith, et al. "A High-Yield Photolithographic Technique for Surface Wave Devices," J. Electro-Chemical Society, 118, 821 (1971).

These alternative methods involve formation of a patterned photoresist or other type of layer on a substrate (which may contain previously patterned layers as well) prior to deposition of the layer for which patterning is desired. Pattern formation of the deposited layer is achieved by subsequent chemical removal of the photoresist and thereby removal of the portions of the deposited layer which had been deposited onto the photoresist. Chemical removal is generally achieved by dissolving, swelling, etc., of the photoresist layer. It has been the experience of those skilled in this art that, unless deposition takes place at an angle very close to normal and the deposited layer is relatively thin (and preferably also under high stress), removal of the photoresist pattern will cause tearing at the edges of the deposited patterned layer. To more fully explain this problem, the deposited layer will be formed on the substrate and on the photoresist layer, including the edges of the photoresist layer. At the edges of the photoresist layer, the deposited film is difficult to remove without tearing the edges of the deposited layer formed on the substrate. To overcome this problem, the photoresist layer preferably has a "reverse bevel" in it. That is, it is undercut when patterned. This is required in order to insure that the photoresist layer and the deposited layer on the photoresist can be removed without tearing the edges of the deposited layer on the substrate surface.

This reverse bevel has been obtained by numerous techniques, as described in references 2 and 3 above.

In reference 2, the stencil has been fabricated by copper plating while in reference 3 an electron beam exposure of a positive acting electron beam resist was used to provide the desired undercutting.

It is difficult to achieve an undercut photoresist pattern since the edges of the photoresist pattern are rounded at the base and top of the pattern and generally the edges tend to be overcut rather than undercut (that is, the bevel at the photoresist edge is often in the wrong direction).

The technique and mask of the present invention is directed to a process for providing a composite structure useful for thin film deposition which does not have this inherent edge-tearing problem. As such, it does not involve the attendant registration problems and thickness limitations which are present when laminated mask structures are used to provide undercuts. As an example of a laminated mask of this type, reference is made to the IBM Technical Disclosure Bulletin, Vol. 12, No. 11, April 1970, at page 1975.

Accordingly, it is a primary object of this invention to provide an improved technique for depositing patterns of thin films having well-defined edges.

It is another object of this invention to provide a composite structure suitable for the deposition of patterned thin films which are not characterized by excessive edge-tearing.

It is still another object of this invention to provide a technique for depositing patterned thin films which does not lead to harmful effects to the substrate onto which deposition occurs or to other layers adjacent to the substrate.

It is another object to provide a process for depositing lines which exhibit minimum penumbra.

BRIEF SUMMARY OF THE INVENTION

This invention comprises the utilization of a deposition mask in which the masking layer is separated from the substrate by an underlying layer which can be patterned. The underlying layer is a photosensitive layer which can be chemically removed after exposure, such as a positive acting photoresist. As is known, this type of resist is rendered soluble in certain solvents after exposure to light. Generally, the photosensitive materials are organic materials, although inorganic photosensitive materials may be used. The masking layer is deposited on the photosensitive layer and is comprised of any material which can be etched. Metals, such as aluminum, are particularly suitable since they are easily deposited by vacuum techniques and are easy to etch. In a particular example, an Al masking layer was deposited on a positive acting photoresist material, such as AZ-1350H photoresist, which is manufactured by the Shipley Corporation, Newton, Massachusetts.

The masking layer is patterned to provide apertures which are smaller than the apertures in the underlying photosensitive layer. That is, the composite structure has a supporting photosensitive layer and an overhanging masking layer. This effectuates a reverse bevel (undercut) in the structure layer without the attendant problems associated with actually forming such an undercut in the photosensitive layer itself.

After formation of the deposition mask, a film is vacuum deposited onto the substrate through the openings in the masking layer and the underlying photosensitive layer. Upon subsequent removal of the masking layer—photosensitive layer structure, a patterned thin film is present which does not exhibit edge-tearing.

These and other objects, features, and advantages will be more apparent from the following more particular description of the preferred embodiments.

DETAILED DESCRIPTION OF THE PREFERRED EMBODIMENTS

Figure 1A:
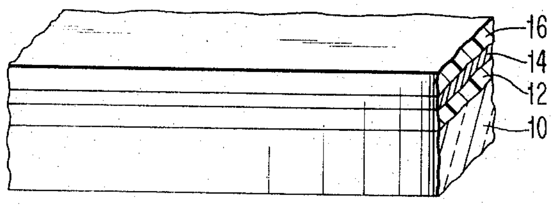
FIGS. 1A–1F show a technique for providing patterned thin films having no edge-tearing using a composite mask.

FIGS. 1A–1F show the formation sequence and use of a composite mask for deposition of thin films. In FIG. 1A, a substrate 10 has formed thereon a first photosensitive layer 12 over which is located a masking layer 14. Deposited onto the masking layer 14 is another photosensitive layer 16. Illustratively, the layers 12 and 16 are photoresist having about 1.5 microns while the masking layer 14 has a thickness approximately 1 micron. The masking layer is conveniently a vacuum deposited metal such as aluminum.

The photoresist layers 12 and 16 are conveniently applied by spinning at 3,500 rpm. Illustratively, lower photoresist layer 12 is cured at 80°C for one hour prior to deposition of masking layer 14 and the upper photoresist layer 16 is cured at 70°C for one hour.

When the masking layer is aluminum, its deposition is conveniently carried out by vacuum deposition from an RF-heated boron nitride crucible with the substrate (surface of photoresist 12) maintained at room temperature during film deposition.

Figure 1B:
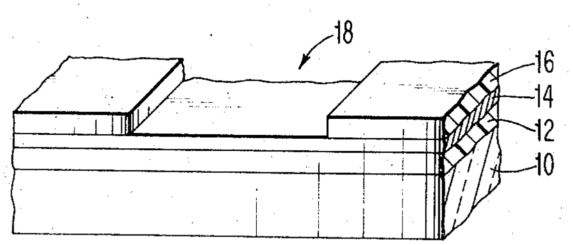

FIG. 1B shows the composite structure with the top photoresist layer 16 patterned. This is achieved by exposing photoresist layer 16 to light through a photographic plate by means of a conventional photoresist exposure apparatus. After exposure, resist development occurs to yield the patterned upper layer 16 as indicated in FIG. 1B.

Figure 1C:
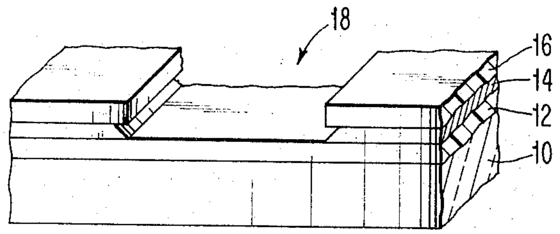

FIG. 1C shows the structure after the masking layer 14 has been patterned. This is conveniently done by etching the masking layer 14. For instance, if the masking layer is an aluminum film etching is conveniently achieved through the use of an etchant consisting of a mixture of phosphoric acid and nitric acid.

Figure 1D:
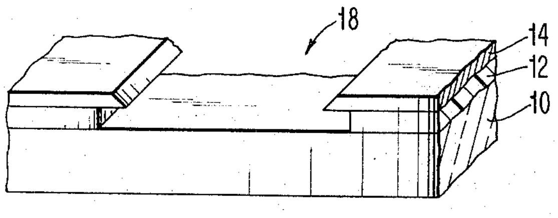

FIG. 1D shows the composite structure after overexposure and development of both the photoresist layer 12 located beneath the aperture in masking layer 14 and photoresist layer 16. Overexposure of the photoresist layer 12 in the aperture 18 using the overlying patterned layer 14 as exposure mask, followed by photoresist development, yields the configuration depicted in FIG. 1D. This structure is characterized by a masking layer 14 separated from the substrate 10 by the underlying photoresist layer 12. The masking layer 14 overhangs the resist layer 12 to form an undercut structure which is very desirable for subsequent deposition of thin films onto substrate 10.

Figure 1E:
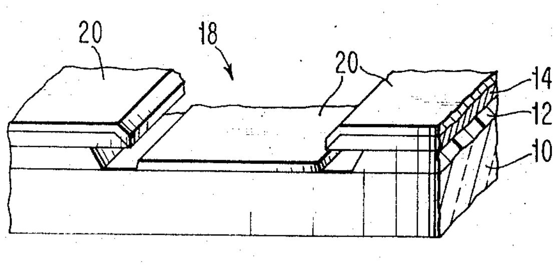

The deposition of a thin film on the substrate 10 using the mask of FIG. 1B is illustrated by FIG. 1E. The film 20 has been deposited by any of a number of well known techniques and forms on the top surface of substrate 10 as well as on the masking layer 14. Illustratively, the deposited film can be a metal or an insulator.

Figure 1F:
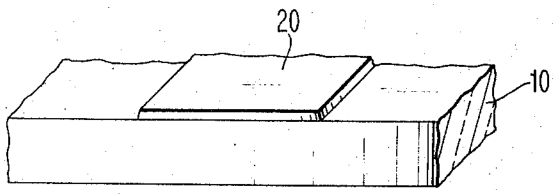

In FIG. 1F, the composite masking layer—photoresist layer is removed as well as those portions of thin film 20 formed over the masking composite. Typically, removal is achieved by immersion of the structure into a solvent such as acetone for about 10–20 minutes, which leaves the desired film pattern shown in FIG. 1F.

In one example a composite mask having photoresist thickness of about 1.5 microns and masking layer thickness of about 1 micron thick, was used to deposit a film of 1 micron thickness implying that thinner films can be successfully deposited using this technique. In some cases, the technique has been used to deposit films thicker than one micron. Further, it should be noted that the edges of the deposited film are smooth, there being no edge-tearing characteristic of many prior techniques. Thus, a very simple fabrication technique is provided using materials (such as aluminum) for masking layers which are spaced from the substrate by an underlying photosensitive layer. The masking layer is a deposited layer on the underlying photosensitive layer rather than being a separate mask placed in contact with and over an underlying mask. This allows fabrication by thin film techniques and provides masks having adjustable spacing from the substrate.

FIG. 2

In order to ascertain the amount of overexposure of the bottom photoresist layer 12 required to provide a convenient amount of undercutting, several samples containing masking layer gaps ranging from about 0.6 to 4.5 mils in width were prepared at different exposure times of the underlying photoresist layer 12. Measurements were then made of the gap widths in the masking layer 14 and in the underlying resist layer 12, after removal of the masking layer 14 by etching. For these samples, the underlying layer was photoresist while the masking layer was aluminum. The photoresist layer 12 had a thickness approximately 1.5 microns while the aluminum layer was approximately 1 micron.

Figure 2:
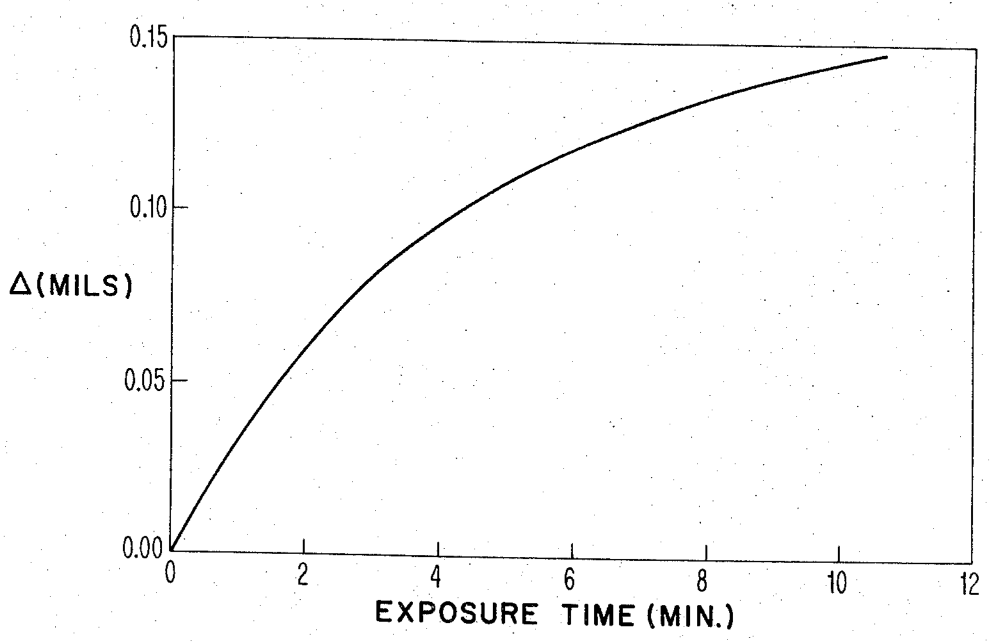
FIG. 2 is an illustrative plot of the difference in gap width (Δ) of the underlying photosensitive and overlying masking layer as a function of exposure time of the underlying photosensitive layer.

FIG. 2 shows the approximate dependence which was found for Δ, the difference in gap width of the overlying aluminum layer 14 and the underlying resist layer 12. As is evident from the figure, the increase with exposure time was nonlinear, as is to be expected from the decrease in light intensity with penetration distance beneath the aluminum layer 14. Typically, an exposure time of five minutes gave a gap width difference Δ of about 0.1 mil, which corresponds to an overlap of about 1 micron (approximately the thickness of the aluminum film) at each edge of the aperture 18. In order to provide an adequate margin of tolerance for the deposition of thin films of about 1 micron thickness, an exposure time of 10 minutes has generally been found to be preferable.

FIG. 3

Figure 3:
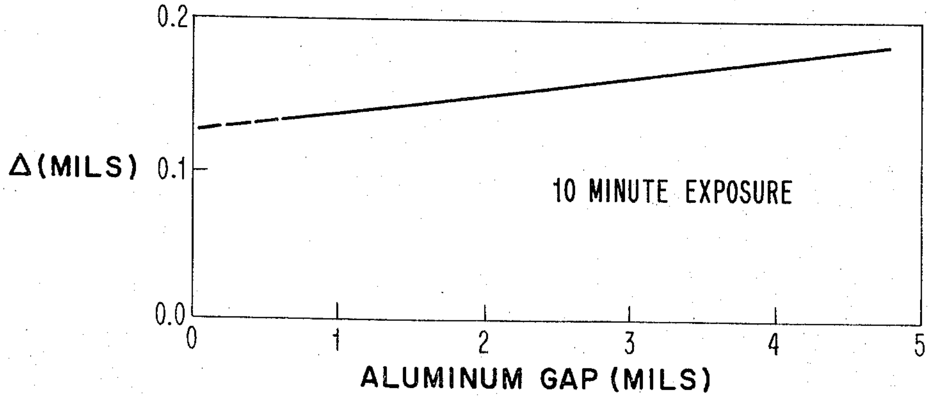
FIG. 3 is an illustrative plot which shows the difference in gap width (Δ) in the underlying photosensitive layer and overlying masking layer as a function of the gap width of the masking layer.

FIG. 3 shows data for the gap width difference Δ as a function of the masking layer gap width. Again, the masking layer is aluminum for this data. As is seen from the figure, Δ increases slightly over the range covered. It is possible that this is due to a combination of more efficient light penetration and developer replenishment beneath the aluminum in patterns having wider gaps. Nevertheless, since the relative increase in Δ is only about 1 percent over the range provided, pattern distortion is negligible for all practical purposes.

What has been described is a technique for depositing patterned thin films using an etched composite and expendable mask. The masking layer is comprised of an etchable material, such as a metal, which is spaced from the substrate by an intervening recessed photosensitive layer, such as photoresist. This method has good utility for providing vacuum deposited films of various materials and is generally useful for producing patterns containing gaps of various dimensions. The patterned film which is deposited through the mask displays no edge-tearing. When the composite mask is removed, a fine residue may result on the edge of the deposited film; however, this is easily removed by immersion into the resist developer for several seconds.

What is claimed is:

1. A method of depositing patterned thin films on a substrate, comprising:
forming a first layer of photosensitive material which can be patterned on said substrate,
forming a masking layer on said first layer,
patterning said masking layer to form openings therein which extend to said first photosensitive layer,
patterning said first photosensitive layer to form openings therein which extend to said substrate and which are aligned with said openings in said masking layer and of larger size than said openings in said masking layer, and
depositing said thin films onto said substrate through said aligned openings using said masking layer as a deposition mask.

2. The method of claim 1, where said masking layer is comprised of an etchable material and said first layer is comprised of positive acting photoresist material.

3. The method of claim 1, where said masking layer is approximately one micron in thickness and said first layer is approximately 1.5 microns in thickness.

4. The method of claim 1, including the further step of removing said first layer and said masking layer after deposition of said thin films on said substrate.

5. The method of claim 1, where said masking layer is patterned by forming a second photosensitive layer of patternable material on said masking layer, patterning said second layer to expose portions of said underlying masking layer, and selectively removing said exposed portions of said masking layer.

6. The method of claim 1, where the openings in said masking layer are about 0.5 – 5 mils in width.

7. The method of claim 1, where said masking layer is vacuum deposited on said first layer.

8. The method of claim 1, where said masking alyer overhangs said first layer at the edges of its opening therein by an amount which is approximately the thickness of said masking layer.

9. A structure for deposition of patterned layers on a substrate, comprising:
a substrate having formed thereon a layer of photosensitive material, there being a layer of masking material vacuum deposited on said photosensitive material,
said photosensitive material and said masking layer having at least one aperture therein which exposes a portion of the surface of said substrate, wherein said aperture in said masking layer is smaller than said aperture in said photosensitive layer and substantially aligned therewith.

10. The structure of claim 9, where said masking layer is comprised of an etchable material.

11. A method for depositing thin films, comprising the steps of:
forming a first layer of photosensitive material on a substrate,
depositing a masking layer on said first layer,
forming a second layer of photosensitive material on said masking layer,
exposing and developing said second layer of photosensitive material to pattern said second layer, there being openings in said second layer which expose portions of the surface of said masking layer,
removing said exposed portions of said masking layer to create openings therein which expose portions of said first photosensitive layer,
exposing and developing the remaining portions of said second photosensitive layer and said first photosensitive layer through said openings in said masking layer to remove said portions of said first photosensitive layer, said first photosensitive layer being overexposed to provide openings therein which are larger than the openings in said masking layer,
depositing said thin film onto said substrate through said openings in said masking layer and said first photosensitive layer, and
removing said first photosensitive layer and said masking layer.

12. The method of claim 11, where said masking layer is comprised of a metal.

13. The method of claim 11, where said masking layer is of the order of a micron in thickness.

14. The method of claim 11, where said deposited thin film is a metallic film.

15. The method of claim 11, where said deposited thin film is an insulator.

16. The method of claim 11, where said masking layer and said thin film are vacuum deposited.

17. A structure for deposition of patterned layers on a substrate, comprising:
a substrate having formed thereon a layer of organic material, there being a layer of masking material vacuum deposited on said layer of organic material,
said organic layer and said masking layer having at least one aperture therein which exposes a portion of the surface of said substrate, wherein said aperture in said masking layer is smaller than said aperture in said organic layer and substantially aligned therewith.

18. The structure of claim 17, wherein the width of said aperture in said organic layer exceeds the width of the aperture in said masking layer by an amount which is about twice the thickness of said masking layer.

* * * * *